United States Patent [19]
Swirhun et al.

[11] Patent Number: 6,001,664
[45] Date of Patent: *Dec. 14, 1999

[54] METHOD FOR MAKING CLOSELY-SPACED VCSEL AND PHOTODETECTOR ON A SUBSTRATE

[75] Inventors: Stanley E. Swirhun; Jeffrey W. Scott, both of Boulder, Colo.

[73] Assignee: Cielo Communications, Inc., Broomfield, Colo.

[ * ] Notice: This patent issued on a continued prosecution application filed under 37 CFR 1.53(d), and is subject to the twenty year patent term provisions of 35 U.S.C. 154(a)(2).

[21] Appl. No.: 08/803,891

[22] Filed: Feb. 21, 1997

Related U.S. Application Data

[63] Continuation of application No. 08/593,117, Feb. 1, 1996, abandoned.

[51] Int. Cl.$^6$ ..................................................... H01L 21/00
[52] U.S. Cl. ................................. 438/31; 438/33; 438/45; 438/46; 438/423; 257/84; 372/50; 372/56; 148/DIG. 95; 148/DIG. 128
[58] Field of Search ................................. 438/31, 33, 45, 438/46, 423, FOR 289, FOR 292; 257/84, 85; 372/31, 50, 96; 148/DIG. 84, DIG. 85, DIG. 95, DIG. 128

[56] References Cited

U.S. PATENT DOCUMENTS

| | | | |
|---|---|---|---|
| 3,859,178 | 1/1975 | Logan et al. | 204/15 |
| 5,019,519 | 5/1991 | Tanaka et al. | 437/22 |
| 5,132,982 | 7/1992 | Chan et al. | 372/50 |
| 5,147,827 | 9/1992 | Chino et al. | 437/237 |
| 5,285,466 | 2/1994 | Tabatabaie | 372/50 |
| 5,288,659 | 2/1994 | Koch et al. | 437/129 |
| 5,292,685 | 3/1994 | Inoguchi et al. | 437/129 |
| 5,331,658 | 7/1994 | Shieh et al. | 372/50 |
| 5,419,804 | 5/1995 | Ojha et al. | 437/129 |
| 5,491,712 | 2/1996 | Lin et al. | 372/50 |
| 5,543,353 | 8/1996 | Suzuki et al. | 437/129 |
| 5,577,064 | 11/1996 | Swirhun et al. | 372/96 |
| 5,606,572 | 2/1997 | Swirhun et al. | 372/96 |
| 5,726,440 | 3/1998 | Kalkhoran et al. | 250/214.1 |

*Primary Examiner*—Wael M. Fahmy
*Assistant Examiner*—Long Pham
*Attorney, Agent, or Firm*—Christie, Parker & Hale, LLP

[57] ABSTRACT

A monolthically integrated VCSEL and photodetector, and a method of manufacturing same, are disclosed for applications where the VCSEL and photodetector require separate operation such as duplex serial data communications applications. A first embodiment integrates a VCSEL with an MSM photodetector on a semi-insulating substrate. A second embodiment builds the layers of a p-i-n photodiode on top of layers forming a VCSEL using a standard VCSEL process. The p-i-n layers are etched away in areas where VCSELs are to be formed and left where the photodetectors are to be formed. The VCSELs underlying the photodetectors are inoperable, and serve to recirculate photons back into the photodetector not initially absorbed. The transmit and receive pairs are packaged in a single package for interface to multifiber ferrules. The distance between the devices is precisely defined photolithographically, thereby making alignment easier.

12 Claims, 8 Drawing Sheets

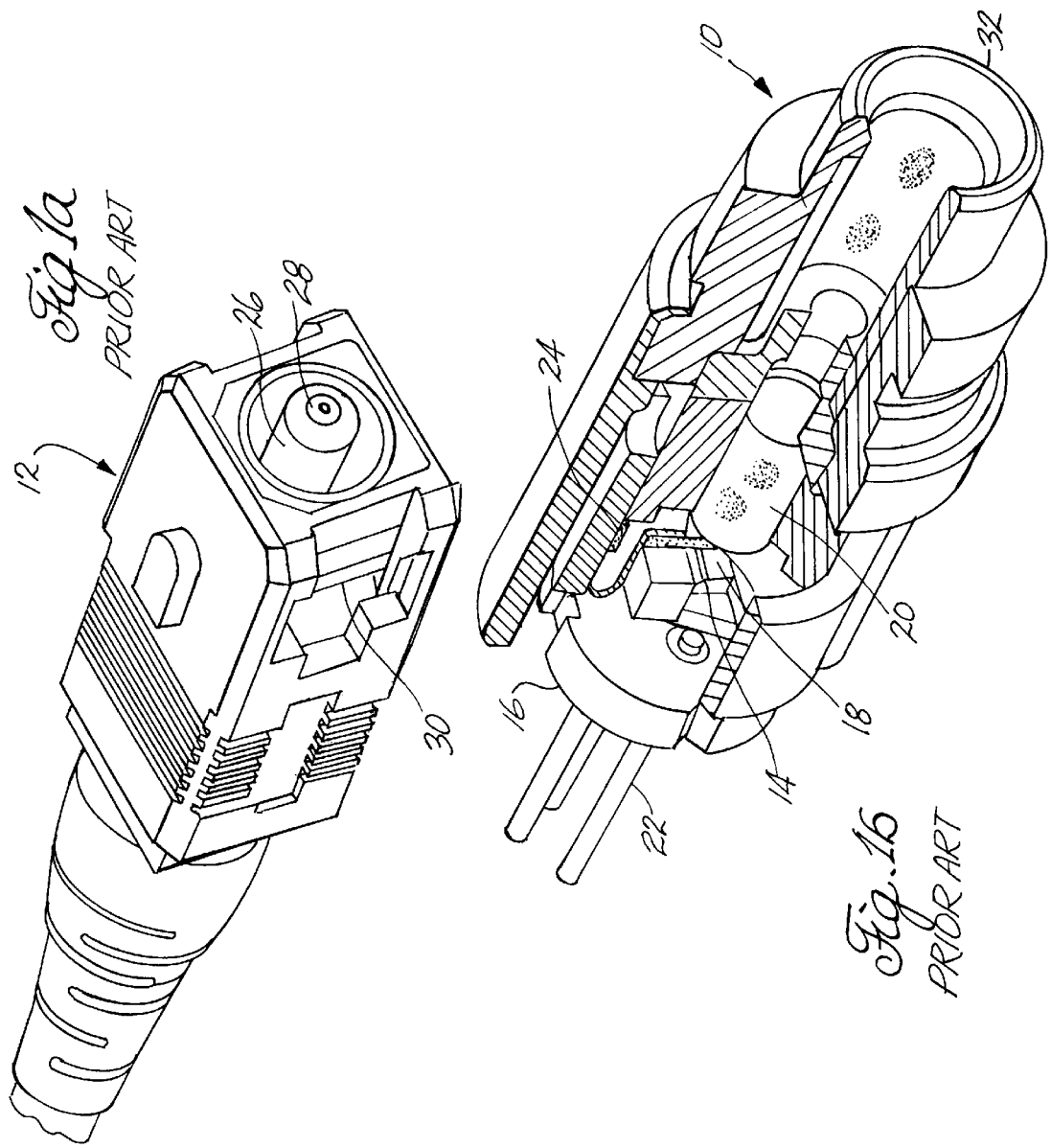

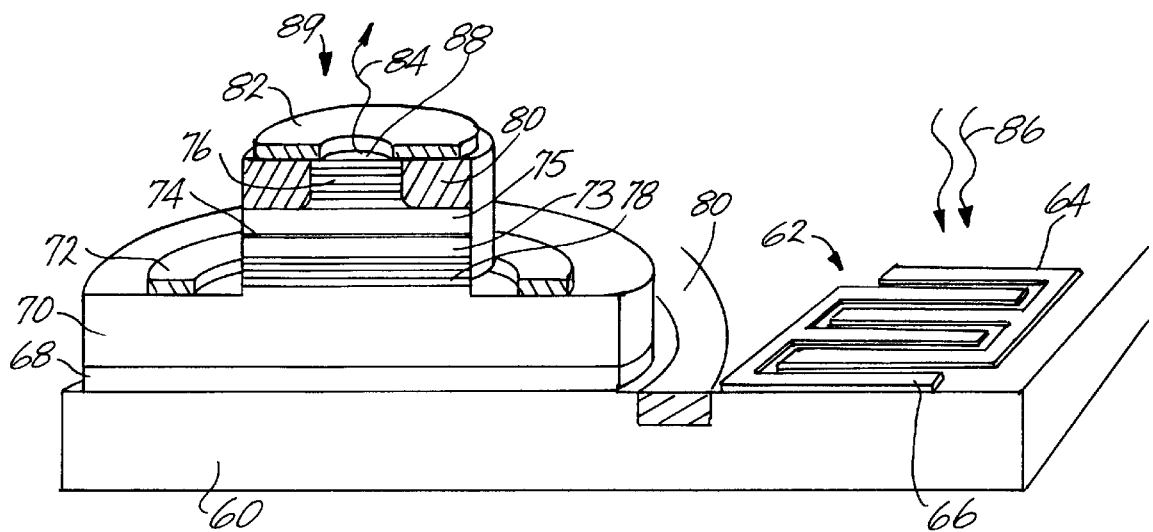

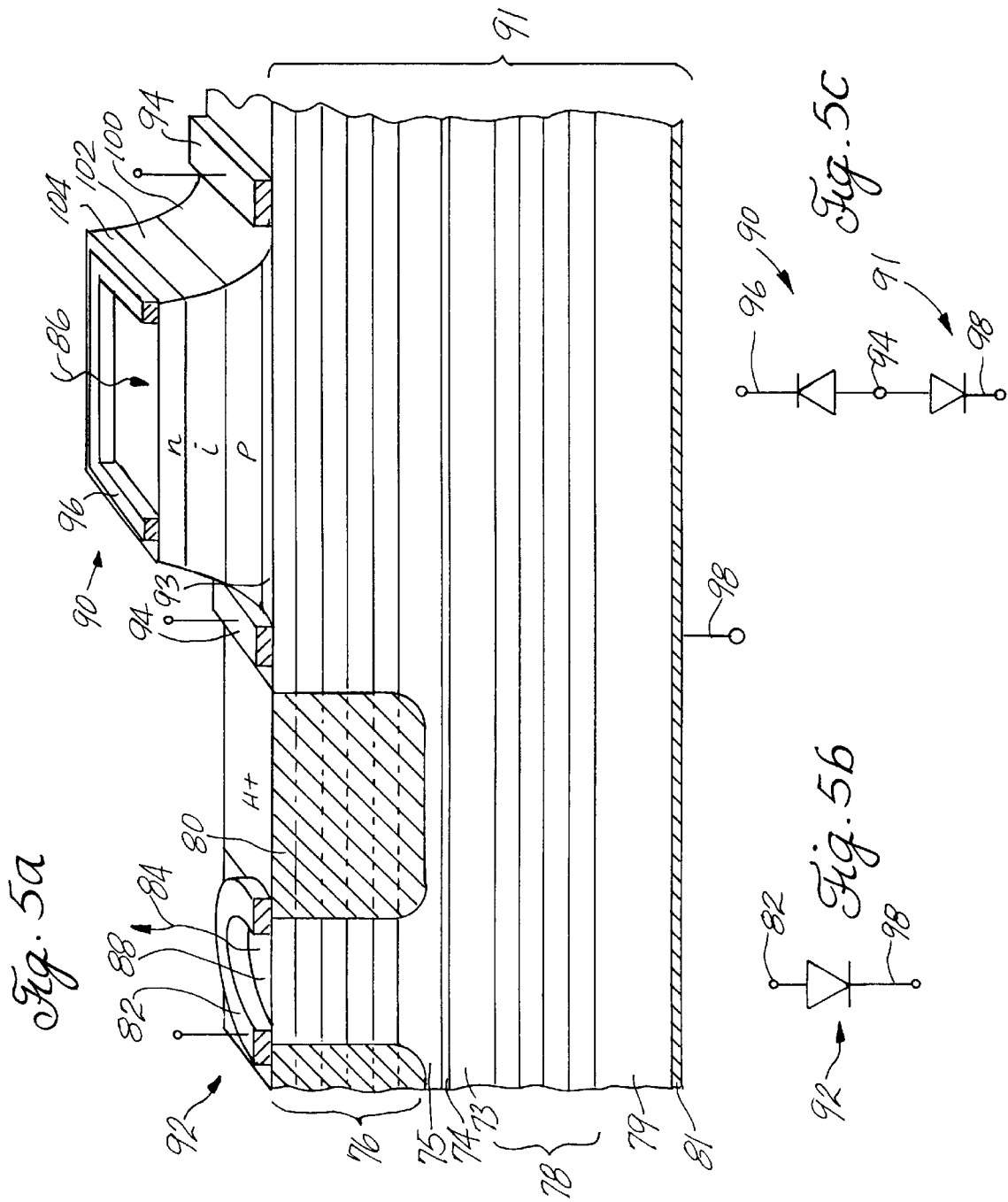

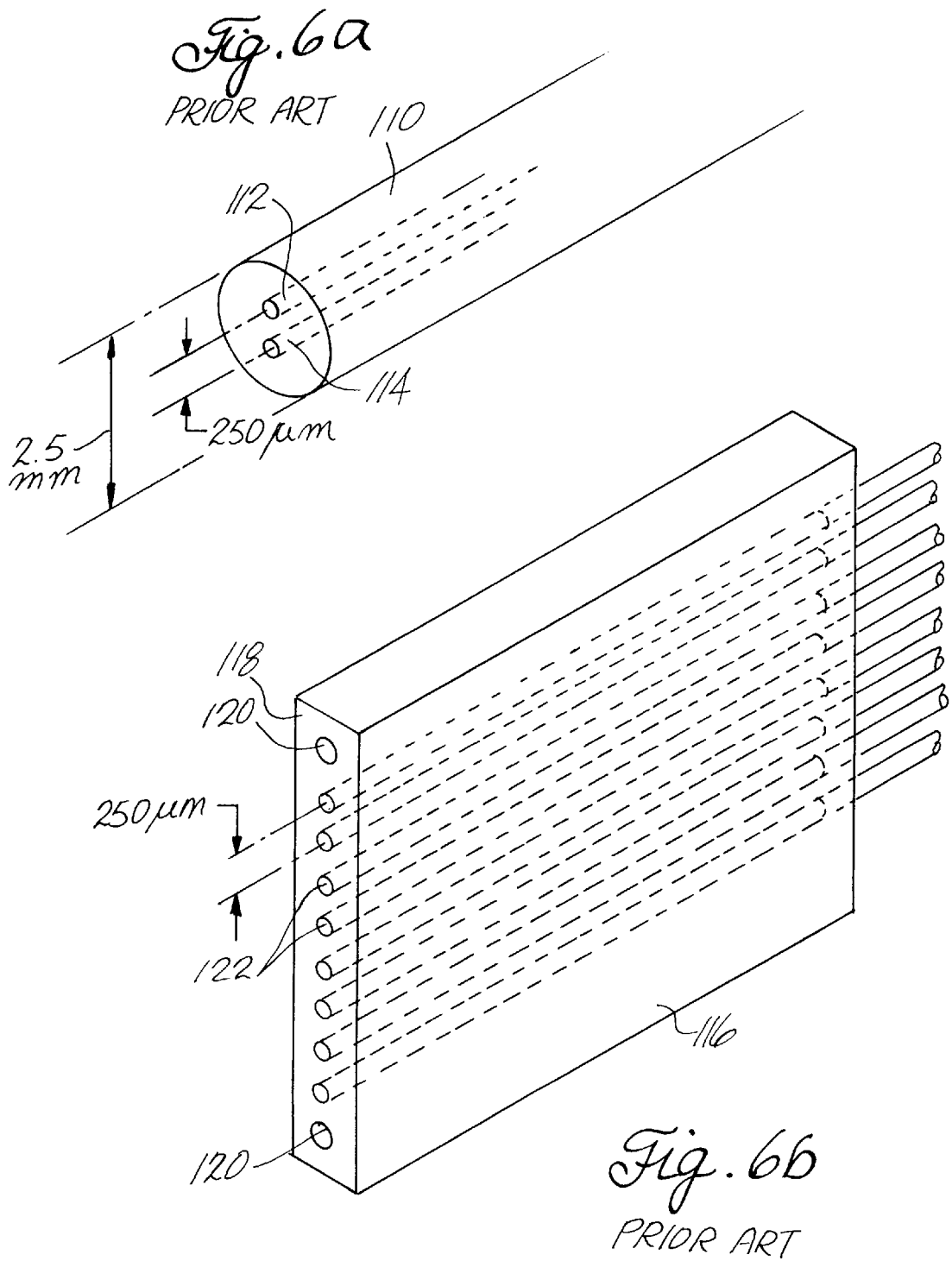

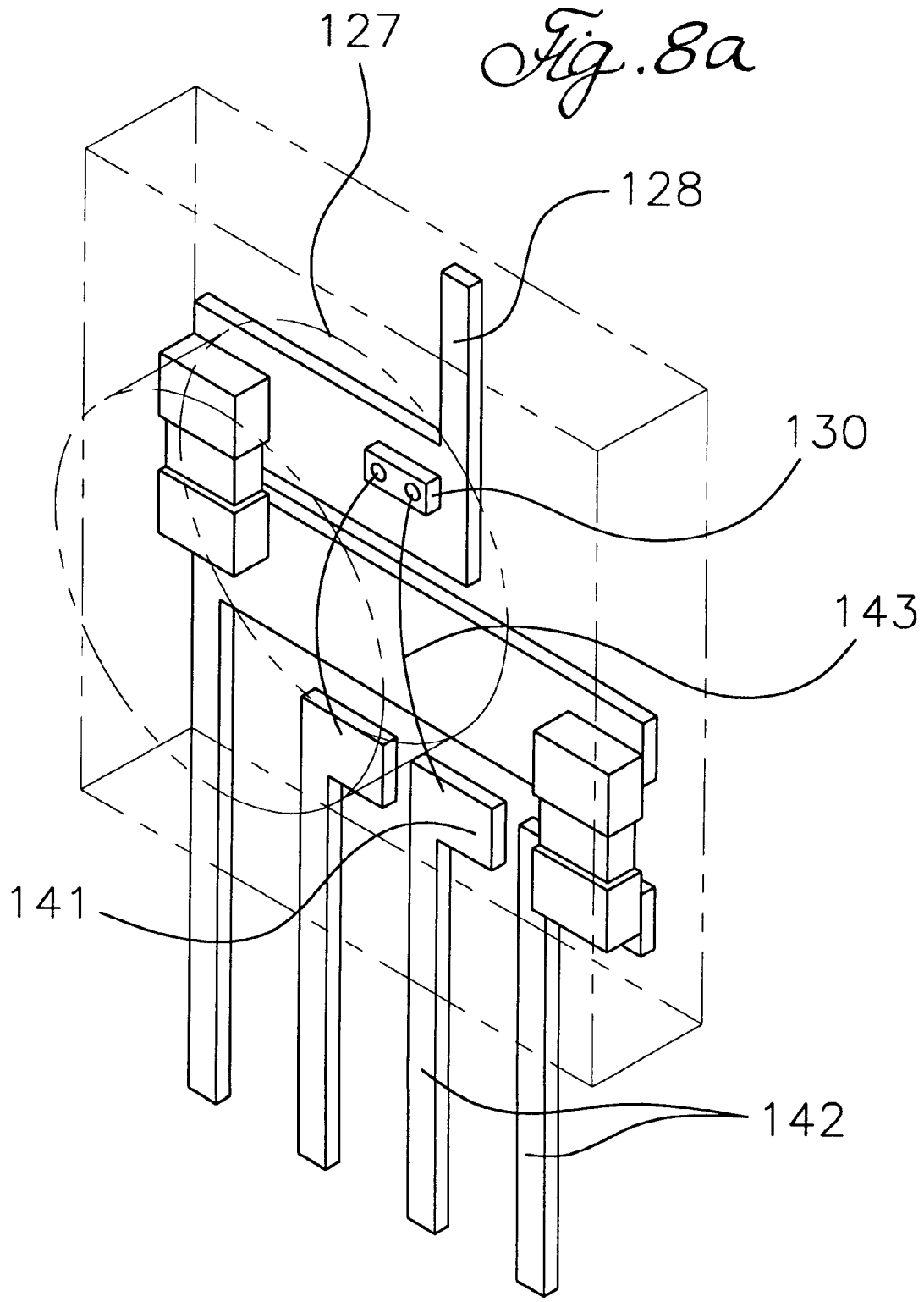

METHOD FOR MAKING CLOSELY-SPACED VCSEL AND PHOTODETECTOR ON A SUBSTRATE

This is a continuation of application Ser. No. 08/593,117 filed Feb. 1, 1996, now abandoned.

BACKGROUND OF THE INVENTION

1. Field of the Invention

The present invention relates to vertical cavity surface emitting lasers (VCSELs) and photodetectors, and more particularly to the application of such optoelectronic devices where they must operate independently but where it is also desirable to have a transmitter and a receiver closely-spaced.

2. Art Background

There are a number of data communications applications which make use of optoelectronic sending and receiving devices (i.e. light emitters and photodetectors). For fiber optic data communication applications requiring less than 200 MBits/sec., light emitting diodes (LEDs) are the light emitters of choice because they are relatively inexpensive to manufacture. For applications requiring higher speeds, lasers are used as the light emitters.

Until recently, most high speed data communications applications employed edge emitting lasers in a serial (single channel) format. With the advent of Vertical Cavity Surface Emitting Lasers (VCSELs), many such applications are now implemented using VCSEL arrays which can be interfaced to ferrules carrying multiple fibers to transmit several bits of data in parallel. At the receiving end, an array of photodetectors is coupled to the multiple fibers. It is the ability to manufacture VCSELs in arrays (an advantage of LEDs) combined with their high speed of operation (an advantage of lasers) which makes VCSELs desirable in such applications.

For high-speed serial duplex data communications applications, however, separately packaged light emitters (usually edge emitting lasers) and photodetectors are still employed. For long-haul applications (typically having distances greater than 1 kilometer), wavelength division multiplexing is often employed to transmit and receive data for a duplex channel over the same fiber. Because the primary cost of a long-haul duplex serial data channel resides in the fiber and its installation, complex beam-splitting techniques can be justified at the ends of the channel to separate the transmit and receive data streams from the single fiber.

For short-haul or "premises" applications, however, the cost of fiber and fiber installation is relatively less important than the cost of the many transmit and receive functions. Thus, it is the cost of the data transmit and receive components, and particularly the optoelectronic devices and their packaging, which drives cost considerations for short-haul applications. Typical short-haul implementations of a high-speed serial fiber optics data communications channel operating in full duplex still employ two multimode fibers; each one to connect an individually packaged transmitting light emitter to an individually packaged receiving photodetector. This is because the cost of complex beam-splitting components can not be justified.

FIGS. 1a and 1b illustrate the components comprising a typical implementation of a transmit or receive link for a short-haul high-speed duplex data communications application. FIG. 1a illustrates a fiber assembly 12. A round ferrule 26 houses an optical fiber 28 which is located precisely in the center of ferrule 26. A typical diameter for ferrule 26 is approximately 2.5 mm. Ferrule 26 comes with a latching mechanism 30 which is used to clamp and secure the ferrule to a barrel 32 of an optical sub-assembly 10 which is depicted in FIG. 1b. Barrel 32 houses optoelectronic device 14 typically in a TO can package 16 which is centrally located in the barrel as shown. Optoelectronic device 14 is typicaly located at an appropriate point within can 16 by a standoff 2. Driver or amplifier circuitry is coupled to optoelectronic device 14 through leads 22. A window 18 is provided in the top of the can package to allow transmitted light out or received light in, depending upon whether the optoelectronic device is a light emitter or a photodetector. The TO package is aligned with fiber 28 and epoxied using epoxy 24 to fix the position of the optoelectronic device with respect to the ferrule 26 and hence fiber 28. Optical elements such as lens 20 are typically provided to focus the light for optimal optical efficiency, particularly where the light emitter is an edge emitting laser. Barrel 32 is designed to mate with latching mechanism 30 of fiber assembly 12.

Both fiber assembly 12 and barrel 10 are precision manufactured for precise mating. Active alignment TO package 16 and optoelectronic device must be performed in the x, y and z axes. First, the optoelectronic device must be precisely aligned within the package 16. Second, the package 16 must be precisely aligned within barrel 10. Finally, optical element 20 must be precisely aligned with respect to its distance from the optoelectronic device 14 to achieve proper optical operation. Because a separate package is required for both the transmit side and the receive side of the duplex data channel, a total of twelve active alignments must be performed for each channel and each channel includes the cost of eight precision-manufactured coupling parts.

FIGS. 1c and 1d provide a schematic illustration of the fiber assembly 12 and optoelectronics subassembly 10 of FIGS. 1a and 1b respectively.

FIG. 2 illustrates a typical duplex serial data communications module 40, which has mounted to it an optical subassembly 52 containing a light emitting device 13 disposed in a TO can package 9 having a window 17, which is to be mated with an optical fiber assembly 46 and which is dedicated to data transmission. Module 40 also has an optical subassembly 50 mounted to it containing a photodetector 15 disposed in TO can package 11 and which is to be mated with optical fiber assembly 48 and dedicated to receiving data from a remote module not shown. Because of the differing optical requirements of the transmit and receive devices, the modules must often be mounted in a staggered fashion as shown. Moreover, the transmit devices are located at an optically appropriate point in their can packages by standoffs 4 and 6 respectively.

Because of the cost of the precision components and the large number of alignments required for implementing duplex serial modules 40, it is highly desirable to integrate the transmit and receive optoelectronic devices (i.e. light emitter and photodetector) into one package. The integration of the two devices into a single package is not, however, an easily achieved solution. The prior art implementations as illustrated in FIGS. 1a–d and 2 cannot be readily adapted to multifiber ferrules currently available for unidirectional data transmission using VCSEL arrays. These multifiber ferrules have fiber spacings which are typically about 250 microns and can be less. The diameter of the TO can package 14 commonly used in present implementations is itself 5600 microns in diameter. Thus, the standard ferrule and barrel would have to grow substantially in diameter to accommodate two fibers having the spacing dictated by the TO cans housing the optoelectronic devices.

Even if a substantially larger barrel could be created to integrate the light emitter and photodetector as commonly packaged to receive both a transmit and a receive fiber, it is not clear that the resulting package could provide the necessary separation of incoming and scattered outgoing light beams to prevent crosstalk between the transmit and receive signals (at least not without complex optics and possibly some form of isolation). Although solutions have been disclosed to stack a light emitter (typically an LED) on top of a photodetector to transmit and receive wavelength division multiplexed signals (the light emitter is transparent to the received wavelength), beam-splitting must still be employed at the opposite end.

Thus, there is room in the art for an improvement in the area of optoelectronic device fabrication which facilitates the integration of one or more pairs of transmit and receive devices for interface with a single ferrule carrying one or more pairs of fibers having spacings as little as 250 microns or less, to substantially reduce the cost and complexity of implementing high-speed serial duplex data communications channels.

SUMMARY OF THE INVENTION

It is therefore an objective of the present invention to provide a VCSEL device sufficiently close to a photodetector device to permit the use of commercially available multifiber ferrules having fibers spaced on the order of 750 microns to 250 microns or less.

It is a further objective of the present invention to provide the closely-spaced but independently operable optoelectronic devices by monolithically integrating the two devices on the same substrate.

It is still further an objective of the invention to provide a process by which multiple pairs of VCSELs and photodetectors can be arrayed on the same substrate.

It is still further an objective of the invention to provide a process by which the closely-spaced but independently operable optoelectronic devices can be packaged using known lead-frame or ceramic packaging technologies.

It is still further an objective of the invention to integrate any requisite optics with either the semiconductor manufacturing technology or the packaging technology.

It is still further an objective of the present invention to simplify significantly the alignment of the fibers to the closely-spaced optoelectronic devices by taking advantage of the photolithographic nature of monolithic semiconductor processing to precisely define the separation between the optoelectronic devices.

It is still further an objective of the invention to provide closely-spaced but independently operable VCSEL and photodetector pairs capable of near-field operation requiring no optics and which permit butt coupling between a package containing the optoelectronic devices and a flat faced multifiber ferrule.

In a first preferred embodiment of the invention, one or more VCSELs are formed using a known process for manufacturing such devices. The one or more VCSELs comprise an n-type GaAs substrate and a first mirror formed on the substrate, which is a well-known distributed Bragg reflector (DBR) a first spacer or cladding layer which is formed on top of mirror. This first mirror is also doped n-type. An active region is then formed on top of the first mirror, the active region comprising at least one quantum well layer or bulk layer. A second spacer or cladding layer is formed on the active region, with a second DBR being formed on the second spacer layer and doped to have p-type conductivity.

On top of the VCSEL layers is grown an etch-stop layer of AlGaAs having about 90% or greater Al content. An extended p-type layer of AlGaAs having more typical alloy proportions is then grown on top of the etch-stop layer. On top of this p-type layer is grown an intrinsic layer (i) which is undoped GaAs. On top of the intrinsic layer is grown an n-type region of AlGaAs. An etching process is then performed to etch away the extended p, i, and n layers where the one or more VCSELs are to be formed. The etching process uses the etch-stop layer to mark the end of the etching process so that the VCSEL area has exposed the top surface of an appropriately designed mirror. A proton implant region is created which separates the one or more VCSELs and the photodetectors formed by the unetched p, i, and n layers. Anode contacts are formed over the non-implanted p regions to form apertures for the VCSELs. A VCSEL cathode contact is formed on the substrate. Anode contacts are also formed on the p region of the p-i-n photodiode and a cathode contact is made to the n region of the p-i-n photodiode.

Thus, in this preferred embodiment, a VCSEL circuit can be isolated from a p-i-n photodiode using a proton implant isolation region which is commonly used to isolate VCSELs formed in arrays. The anode contacts to the p region of the p-i-n photodiode may be coupled to ground so that the VCSEL structure which lies underneath the p-i-n photodiode is never turned on and other bipolar parasitic effects are avoided. The width of the proton implant isolation region is typically between 50 and 100 microns. Thus, the VCSEL and the p-i-n photodiode can be separated by an accurately known distance, significantly less than 250 microns if desired. Moreover, the difference in thickness between the VCSEL and the p-i-n photodiode is small, thereby permitting near-field coupling of the optoelectronic devices to fibers.

One significant advantage of the first embodiment of the invention is that it requires very few additional steps to an otherwise typical VCSEL manufacturing process. A second advantage is that, when an anti-reflection coating of silicon nitride is applied to the photo-receiving n region of the photodiode, in conjunction with the p-type mirror which underlies the p-i-n photodiode, a high degree of efficiency is achieved. The silicon nitride anti-reflection coating increases transmission of incoming light into the surface of the p-i-n photodiode. Additionally, any light which is not absorbed by the intrinsic layer of the photodiode on its way through will be reflected from the underlying p-type mirror back into the intrinsic layer and will then have a second opportunity to be absorbed.

A second preferred embodiment of the invention employs a VCSEL with an MSM photodiode. The VCSEL is manufactured on a semi-insulating substrate. Because the MSM photodetector employs the semi-insulating layer as its common cathode, the two optoelectronic devices are virtually isolated from one another electronically as a result. A photolithographically defined minimum spacing of 250 microns or less can also be achieved using the second preferred embodiment of the invention. An anti-reflection coating is also preferably employed over the MSM photodetector to increase efficiency. To further enhance electrical isolation between the two devices, an isolation region can also be formed, preferably by implantation. Another advantage of using an MSM photodiode is that the two anode terminals can be used to drive a differential amplifier, thereby permitting common-mode rejection of noise.

Either of the two preferred embodiments can be integrated with optically transmissive materials which can be formed into lenses on the surface of the semiconductor. Either embodiment can also be implemented within standard precision manufactured barrels to be aligned with circular ferrules containing multiple fibers. Finally, either embodiment can be encapsulated using known lead-frame or ceramic packaging technology to permit near-field flat coupling between a flat package having an optically transmissive surface and a commercially available flat rectangular ferrule containing multiple fibers.

In one aspect, the present inventions provides a method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, forming photodiodes distributed across the wafer, and defining active and inactive VCSELs by forming isolation regions around the second mirror layers of the active VCSELs.

In another aspect, the present inventions provides method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, forming photodiodes distributed across the wafer, and defining active and inactive VCSELs by forming proton implant isolation regions around the second mirror layers of the active VCSELs.

In a still further aspect, the present invention provides a method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, forming photodiodes distributed across the wafer, and defining active and inactive VCSELs by forming proton implant isolation regions 50–100 microns wide around the second mirror layers and extending vertically through the second mirror layers to the second cladding layer.

In still another aspect, the present invention provides a method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, forming photodiodes distributed across the wafer, and forming VCSEL anode contacts overlapping a topmost second mirror layer and the isolation region of the active VCSELs.

In still another aspect, the present invention provides a method of manufacturing monolithic VCSEL and photodetector pairs by first forming a plurality of VCSEL cathode layers directly on a semiconductor wafer substrate, forming VCSEL layers directly on the semiconductor wafer substrate, then forming photodiodes distributed across the wafer.

In still another aspect, the present invention provides a method of manufacturing monolithic VCSEL and photodetector pairs by forming VCSEL layers directly on a semiconductor wafer substrate, then forming photodiodes distributed across the wafer directly on the semiconductor wafer substrate at discrete locations.

In still another aspect, the present invention provides a method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, defining active regions and inactive regions by forming isolation regions in the VCSEL layers, and then forming photodiodes distributed across the wafer on the second mirror layers of inactive VCELs.

In still another aspect, the present invention provides a method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, forming photodiodes distributed across the wafer by forming distributed p-type layers on a topmost second mirror layer, forming an intrinsic layer on the distributed p-type layers, forming an n-type layer on the intrinsic layers, forming a photodiode cathode contact on each of the n-type layers, and forming distributed photodiode anode contacts on the topmost second mirror layer.

In another aspect, the present invention provides a method of manufacturing an integrated VCSEL and photodetector pair by forming layers of a VCSEL on a semiconductor substrate, forming layers of a photodiode on a top-most layer of a first portion of the VCSEL layers, isolating a second portion of the VCSEL layers from the photodiode layers by implanting an isolation region between the first and second portions of the VCSEL layers, forming a VCSEL cathode contact connected to the semiconductor substrate, forming a VCSEL anode contact connected to the top-most VCSEL layer in the second portion, forming a photodiode cathode contact on a topmost layer of the photodiode layers, and forming a photodiode anode contact on the top-most VCSEL layer of the first portion of the VCSEL layers.

The foregoing objectives and the features of the preferred embodiments will be understood by those of skill in the art with reference to the following detailed description.

BRIEF DESCRIPTION OF THE DRAWINGS

FIG. 1a (prior art) illustrates a fiber assembly of a typical implementation of a high-speed data transmission link using a single optoelectronic device for each half of a duplex channel.

FIG. 1b (prior art) illustrates an optical assembly of a typical implementation of a high-speed data transmission link using a single optoelectronic device for each half of a duplex channel.

FIG. 3 illustrates a cross-section of an integrated VCSEL and an MSM photodetector in accordance with the present invention.

FIG. 4 illustrates a monolithic plan view of a preferred embodiment of the invention.

FIG. 5a illustrates a cross-section of a VCSEL and a p-i-n photodiode in accordance with the present invention.

FIG. 5b illustrates the orientation of the VCSEL laser diode and as illustrated by the cross-section in FIG. 5a.

FIG. 5c illustrates the orientation of the photodiode as illustrated by the cross-section in FIG. 5a.

FIG. 6a (prior art) illustrates a commercially available dual fiber version of a round fiber ferrule.

FIG. 6b (prior art) illustrates a commercially available rectangular multifiber ferrule.

FIG. 8a illustrates how a transmit and receive pair made in accordance with the present invention can be packaged to interface with a round multifiber ferrule such as the one illustrated in FIG. 6a.

DETAILED DESCRIPTION OF THE INVENTION

Figure 1C:
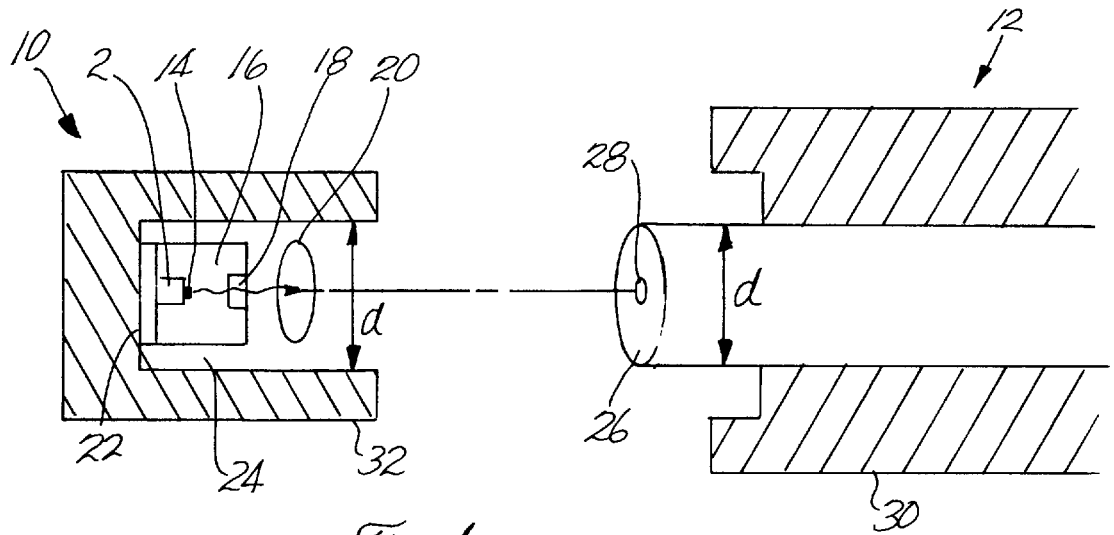
FIG. 1c (prior art) illustrates a schematical view of the fiber assembly of FIG. 1a and the optical assembly of FIG. 1b.
Figure 1D:
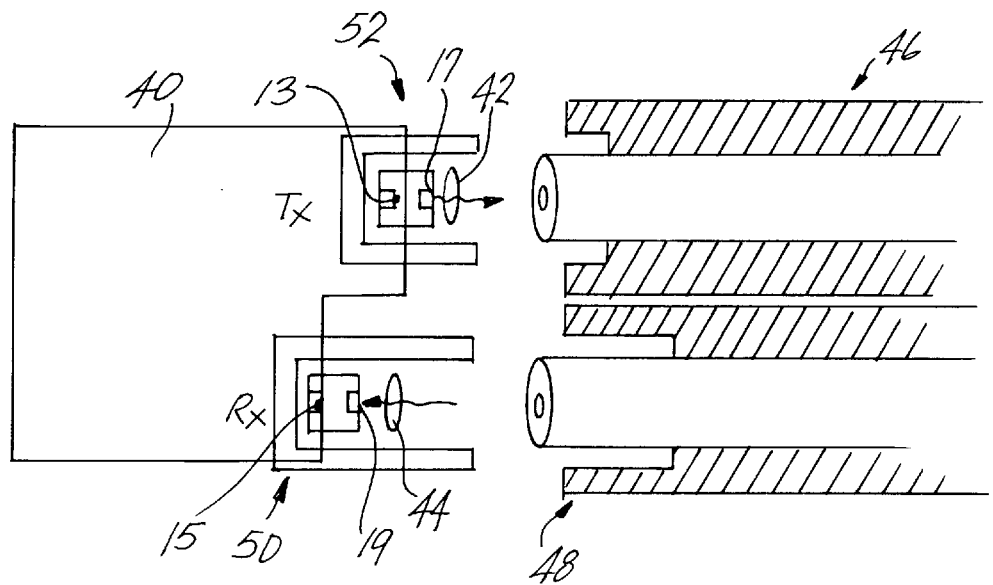
FIG. 1d (prior art) illustrates the high-speed duplex data communications module using known precision manufactured parts to implement the transmit and receive links of a high-speed duplex data communications channel of FIG. 2.
Figure 2:
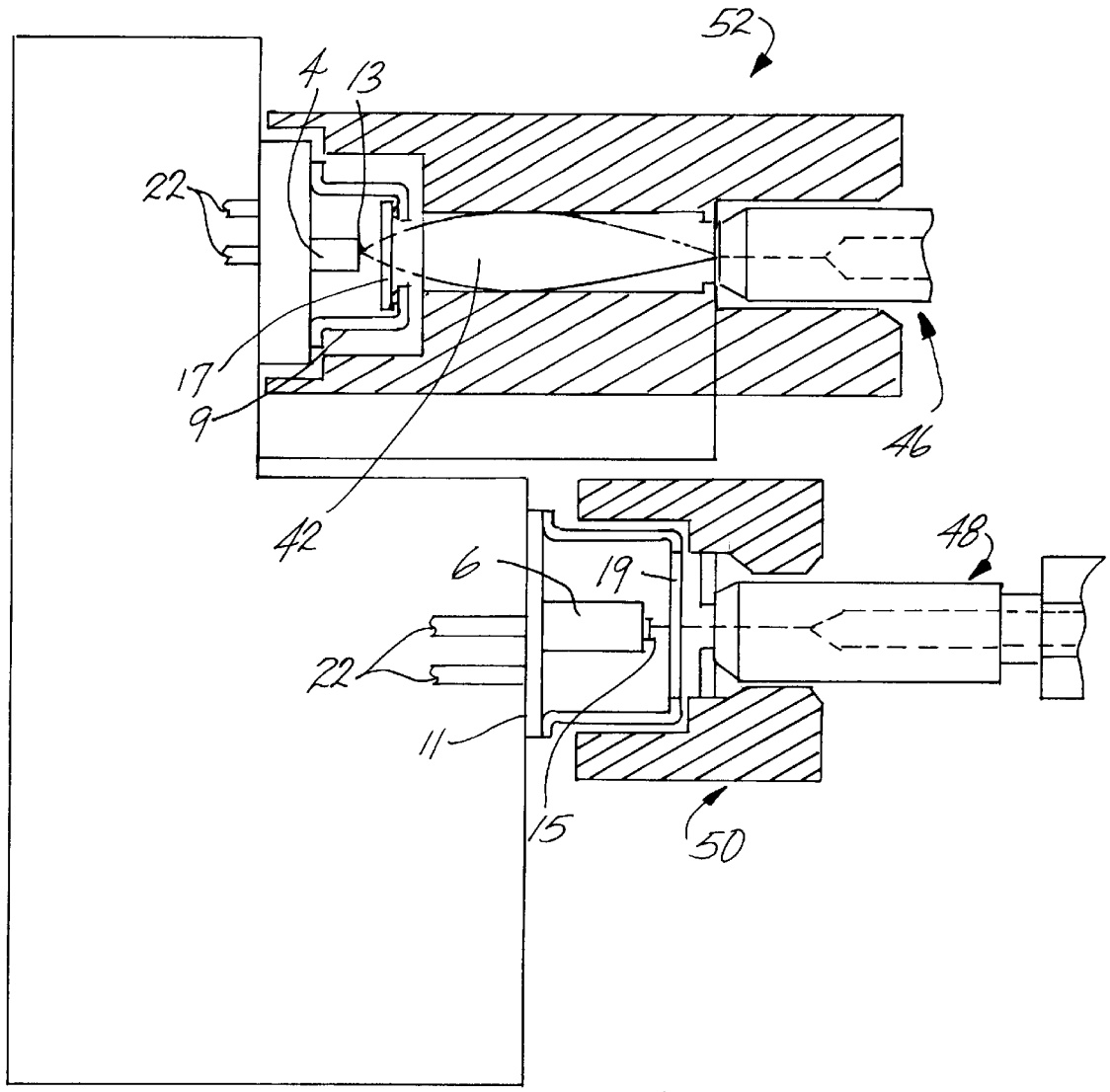
FIG. 2 (prior art) illustrates a high-speed duplex data communications module using known precision manufactured parts to implement the transmit and receive links of a high-speed duplex data communications channel.

The present invention is a monolithic semiconductor device having a VCSEL integrated with a photodetector on the same substrate, the VCSEL and photodetector to be operated independently as a transmit and receive device respectively. The VCSEL and photodetector are physically situated in close enough proximity to permit packaging of one or more pairs of the VCSEL and photodetector such that they may be coupled to multifiber ferrules having fiber spacings on the order of 250 microns or less. The present invention also includes a method of manufacturing the independently operated VCSEL and photodetector, as well as the packaging and coupling of one or more pairs of the integrated VCSEL and photodetector and their coupling to multifiber ferrules.

A first preferred embodiment of the invention is now discussed in detail in conjunction with FIGS. 3 and 4. As shown in FIG. 3, a VCSEL and a metal-semiconductor-metal (MSM) photodetector are integrated on the same semi-insulating GaAs substrate. The conductance of the semi-insulating substrate is typically between about $10^{-12}$ and $10^{-5}$ ohm-cm. The VCSEL is built on top of the substrate beginning with an n− layer 68, upon which an n+ layer 70 is grown which forms the cathode of the VCSEL.

A first mirror 78 is formed on layer 70, which is preferably an epitaxially formed distributed Bragg reflector (DBR) which comprises a plurality of alternating semiconductor layers having high and low indices of refraction, with each layer having a thickness of $\lambda/4n$, where $\lambda$ is the wavelength of the optical radiation emitted from the laser and n is the index of refraction of the layer. The semiconductor layers are doped to achieve n-type conductivity. A quantum well (QW) active region 74 is formed between a first spacer 73 and a second spacer 75, with first spacer 73 formed on the top layer of the first mirror 78. Active region 74 has at least one QW layer.

A second mirror 76 is formed on second spacer 75 and is preferably an epitaxially grown DBR which is comprised of a plurality of alternating semiconductor layers having high and low indices of refraction, with each layer having a thickness of $\lambda/4n$, where $\lambda$ is the wavelength of the optical radiation emitted from the laser and n is the index of refraction of the layer. The second mirror 76 is doped to achieve a p-type conductivity. An isolation implant 80 is formed around the second mirror 76, and preferably extends to a depth just inside spacer 75. A mesa region is then etched around the outside of the VCSEL 89 to a depth which exposes the cathode layer 70. A cathode contact 72 is then formed on the exposed surface of cathode layer 70, and an anode contact 82 is formed which overlaps the surface of isolation implant region 80 and the top-most layer of second mirror 76, and which further defines an aperture 88 which comprises a portion of the surface of the top-most layer of second mirror 76. Radiation 84 is emitted through aperture 88.

The MSM photodetector 62 is formed on the surface of the semi-insulating substrate 60 as two non-electrically coupled metal patterns 62 and 64, each having fingers which are interdigitated with one another. When one or both of the patterns is biased to some voltage, carriers generated by received light are swept to the anodes of the two diodes by the applied electric field. Because the MSM operates without conducting any current through the substrate 60, there is virtually no electrical crosstalk or leakage between the VCSEL 89 and the MSM photodetector 62. Thus, the VCSEL 89 can emit radiation 84 from aperture 88 based on digital data to be transmitted while MSM photodetector 62 can receive radiation 86 in which is encoded digital data received from a remote data source. To achieve even better isolation, an isolation region 80 can be formed preferably by proton implant between VCSEL 89 and MSM photodetector 62.

FIG. 4 illustrates a plan view of the device which is shown as a cross-section in FIG. 3. For clarity, corresponding structures will be indicated by identical index numbers. The cathode layer 70 and its metal cathode contact 72 of the VCSEL are extended to the boundary of substrate 60 which is furthest away from MSM photodetector 86. Bond wire 71 can then be used to connect cathode contact 72 to a bond pad of, for example, a lead frame. The VCSEL anode contact 82 is brought to the same substrate boundary by bond wire 77, metal extender 79 and bond wire 69. Metal patterns 66 and 64, which form the anode and anode terminals of MSM photodetector 62, are also bonded to the leads of whatever form of packaging is used. One of the metal patterns is typically coupled to a bias voltage while the other is coupled to ground or a different bias voltage. An anti-reflection coating can be employed on the MSM to increase optical efficiency.

A second preferred embodiment is disclosed in FIG. 5a. For convenience and clarity, like structures will be denoted by the same index numbers as in previous figures. This particular embodiment is preferred because it can be implemented using more standard VCSEL manufacturing processes. A first mirror 78 is formed on a standard semiconductor GaAs substrate 79. The first mirror is preferably a semiconductor DBR comprising twenty to thirty periods of AlAs/AlGaAs layers. Each of the layers has a thickness of $\lambda/(4n)$ and is doped to have n-type conductivity. A first spacer or cladding layer 73 is then formed on first mirror 78, which is either undoped or very lightly doped. An active region 74 is then formed on the first spacer 73 which comprises at least one GaAs QW layer. A second mirror 76 is then formed on top of a second undoped or very lightly doped spacer or cladding layer 75. The second mirror 76 again preferably consists of alternating layers of AlAs/AlGaAs layers, each being $\lambda/(4n)$ thick. Second mirror 76 is doped to have p-type conductivity. On top of second mirror 76 is formed a thin etch-stop layer 93, which has a significantly higher ratio of Al to Ga, about 9 to 1 or greater. On top of the etch-stop layer 93, an extended p-type layer 100 of AlGaAs is formed. On top of p-type layer 100 is formed an intrinsic layer (i) 102 of undoped GaAs. Finally, an n-type layer 104 is formed on top of intrinsic layer 102.

The structure is then etched in those areas where a VCSEL is to be formed, and not etched where a p-i-n photodiode is to be formed. The etch strips away the n-type layer 104 and intrinsic layer 102 and continues into p-type layer 100 until the etch-stop layer 93 is detected. The etching process is terminated so that the etch-stop layer is etched away and an appropriately thick top layer of second mirror 76 is exposed. Those of skill in the art will recognize that there are other well-known techniques by which the endpoint of an etching process may be detected to end the etching process at the appropriate time and which are intended to be within the scope of the present invention. A proton isolation implant is performed to create isolation region 80 between VCSEL 92 and p-i-n photodiode 90. The implant region 80 typically achieves a depth which extends just inside spacer layer 75 and has a width preferably between about 50 and 100 microns. A circular metal contact 82 is then formed on the top of mirror 76 and which overlaps slightly implant region 80. Contact 82 provides access to the anode of VCSEL 92. A contact 81 is then formed on the back side of substrate 79 and serves as the cathode terminal of VCSEL 92. Contacts 94 are preferably formed on both sides of p-i-n photodiode 90 which provide electrical access to the anode of p-i-n photodiode 90 as well as to the anode of the VCSEL 91 which underlies p-i-n photodiode 90. Finally, contact 96 is formed on n-type layer 104 to form the cathode of p-i-n photodiode 90. An anti-reflection coating preferably having a thickness of about one quarter wavelength is applied to photo-receiving surface 101.

A simplified schematic of the structure of FIG. 5a is shown in FIG. 5b. VCSEL 92 is operated with forward bias between anode terminal 82 and cathode terminal 98 to produce radiation 84 having a wavelength of $\lambda$. p-i-n photodiode 90 is operated with reverse bias between cathode contact 96 and anode contacts 94. Moreover, anode contacts 94 are shorted to substrate contact 98 to ensure that VCSEL 91 will not become forward biased and emit light. Thus, VCSEL 92 can be operated to emit light encoded with data to be transmitted to a remote receiver employing a similar structure, and p-i-n photodiode 90 can operate to receive radiation 86 which is encoded with data received from the same remote terminal.

Those of skill in the art will recognize that the exact order in which the process steps take place, as well as the particular material system used, are irrelevant to the patentability of the present invention. For example, one material system might include a GaAs substrate, GaAs quantum wells, DBR layers of AlAs and AlGaAs, and an intrinsic layer of GaAs. The p and n layers of the p-i-n would also be made of AlGaAs. Other known material systems may be used to produce different wavelengths of emitted radiation and the particular dimensions of the integrated devices may be changed to suit particular transmission modes or packaging requirements. Moreover, although it is desirable that the photolithographically defined spacings between the transmit and receive pairs are preferably small, of course larger spacings can be easily accomodated by the present invention.

Those of skill in the art will recognize many advantages of the second preferred embodiment of FIG. 5a is that a typical process used to create arrays of VCSELs. including the isolation implant commonly used to separate the individual VCSELs of the array, can be used to create arrays of VCSEL/p-i-n photodiode pairs. The additional steps required to build the p-i-n photodiode on top of the VCSEL process are negligible in cost. Moreover, the difference in the thickness of the two devices is also negligible for purposes of facilitating near-field coupling of the devices to fibers to eliminate the need for optics. Additionally, due to the underlying second mirror of inoperable VCSEL 91, any light not absorbed by the intrinsic layer 102 of p-i-n photodiode 90 will be reflected back into intrinsic layer 102, thus having a second chance to be absorbed. Finally, the thicker the intrinsic layer, the lower the capacitance of the p-i-n diode (the faster its operation) and the better its optical efficiency.

FIG. 6a illustrates how the commonly used single fiber round ferrule can be implemented using two or more fibers. Such fibers are now currently available from Siecor as prototypes. The cylindrical ferrule 110 has the same dimensions (i.e., 2.5 mm) as those ferrules commonly used with only one fiber. Thus, one fiber 112 can be used for transmitting data as coupled to a VCSEL while fiber 114 can be used to receive data from a remote transmitter as coupled to a photodetector.

FIG. 6b illustrates a commonly available rectangular ferrule which can have eight or more fibers 122, and which has guides 120 for receiving alignmnent pins. Rectangular ferrule 116 typically has a polished face 118 for coupling to an array of transmitting VCSELs. This rectangular ferrule 116 can be easily adapted to devices made in accordance with the present invention, such that each pair of fibers 122 can be aligned with a pair of integrated VCSEL/photodetectors.

Figure 7A:
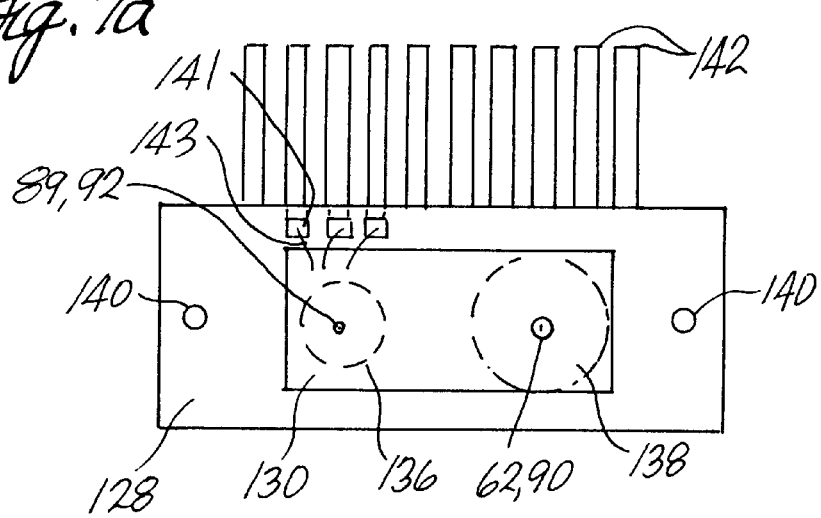
FIG. 7a illustrates how the present invention can be packaged using conventional lead-frame technology to facilitate interface to a rectangular multifiber ferrule.
Figure 7B:
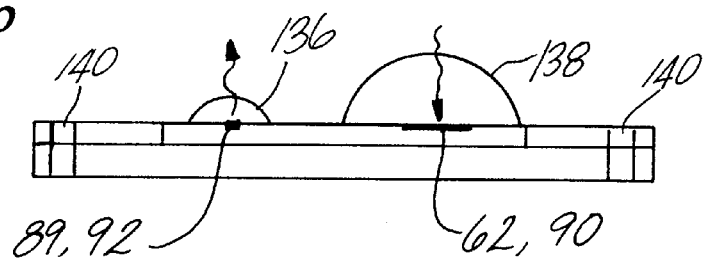
FIG. 7b illustrates how optical lenses can be integrated with the present invention.

FIG. 7a illustrates how a single VCSEL/photodetector pair could be packaged using standard lead-frame technology to be interfaced to a rectangular multifiber ferrule such as the one illustrated in FIG. 6b. Integrated transmit/receive chip 130 can be epoxied to lead frame 128 and then bonded to bond pads 141 via bond wires 143. If optics are required, lenses 138 and 136 can be formed over VCSEL 89, 92 and photodetector 62,90 respectively, either using materials which are formed over chip 130 during the manufacturing of chip 130 or such optics can be integrated within the surface of the plastic encapsulation formed by the package. Lead frame 128 can also have guide pins 140 to be used in conjunction with a rectangular ferrule such as the one shown in FIG. 6b. FIG. 7b shows a side view of FIG. 7a to illustrate the use of optics over photodetector 62, 90 and VCSEL 89, 92.

Figure 7C:
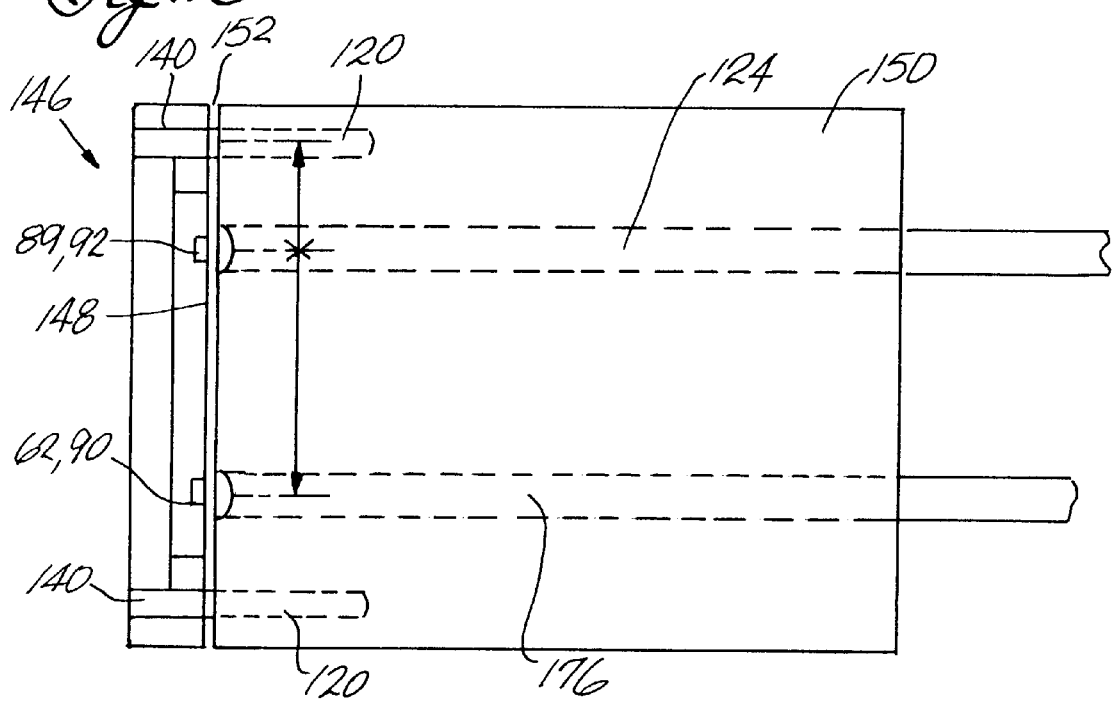
FIG. 7c illustrates how the present invention can be implemented using butt coupling technology.

FIG. 7c illustrates how lead frame 128 can be butt coupled to a rectangular ferrule 150 containing two fibers 124 and 126. If distance 160 is fairly precisely known, and distance 147 between fibers 124 and 126 is fairly precise, a fairly accurate alignment can be achieved between fibers 124 and 126 and VCSEL 89, 92 and photodetector 62, 90, because the distance between VCSEL 89, 92 and photodetector 62, 90 are fairly precise based on the photo-optical alignment process used in manufacturing the integrated semiconductor 130. Thus, a fairly accurate positioning of the chip 130 with respect to the lead frame 128 during packaging will provide a reasonably accurate passive alignment. Of course, fine alignment can be achieved using well-known active alignment techniques. A further advantage of the coupling technique shown in FIG. 8 is that no optics must be interposed between package 146 and ferrule 150 if the coupling distance 152 is close enough. Of course, a flat transmissive surface 148 can be easily achieved on package 146.

FIG. 8 illustrates a lead-frame package which can be used to interface with a round multifiber ferrule such as the two-fiber ferrule of FIG. 6a. Barrel 127 is designed to precisely mate with the round ferrule of FIG. 6b.

What is claimed is:

1. A method of manufacturing monolithic VCSEL and photodetector pairs, said method comprising the steps of:
    forming VCSEL layers directly on a semiconductor wafer substrate by
        forming first mirror layers;
        forming a first cladding layer on said first mirror layers;
        forming an active region on said first cladding layer;
        forming a second cladding layer on said active region;
        forming second mirror layers on said second cladding layer;
    forming photodiodes distributed across said wafer; and
    defining active and inactive VCSELs by forming isolation regions around said second mirror layers of said active VCSELs.

2. A method of manufacturing monolithic VCSEL and photodetector pairs, said method comprising the steps of:
    forming VCSEL layers directly on a semiconductor wafer substrate by
        forming first mirror layers;
        forming a first cladding layer on said first mirror layers;
        forming an active region on said first cladding layer;
        forming a second cladding layer on said active region;
        forming second mirror layers on said second cladding layer;
    forming photodiodes distributed across said wafer; and
    defining active and inactive VCSELs by forming proton implant isolation regions around said second mirror layers of said active VCSELs.

3. A method of manufacturing monolithic VCSEL and photodetector pairs, said method comprising the steps of:
    forming VCSEL layers directly on a semiconductor wafer substrate by
        forming first mirror layers;
        forming a first cladding layer on said first mirror layers;
        forming an active region on said first cladding layer;
        forming a second cladding layer on said active region;
        forming second mirror layers on said second cladding layer;
    forming photodiodes distributed across said wafer; and
    defining active and inactive VCSELs by forming proton implant isolation regions 50–100 microns wide around said second mirror layers and extending vertically through said second mirror layers to said second cladding layer.

4. A method of manufacturing monolithic VCSEL and photodetector pairs, said method comprising the steps of:
    forming VCSEL layers directly on a semiconductor wafer substrate by
        forming first mirror layers;
        forming a first cladding layer on said first mirror layers;
        forming an active region on said first cladding layer;
        forming a second cladding layer on said active region;
        forming second mirror layers on said second cladding layer;
    forming photodiodes distributed across said wafer; and
    forming VCSEL anode contacts overlapping a topmost second mirror layer and said isolation region of said active VCSELs.

5. A method of manufacturing monolithic VCSEL and photodetector pairs, said method comprising the steps of:
    forming VCSEL layers directly on a semiconductor wafer substrate; then
    forming photodiodes distributed across said wafer directly on said semiconductor wafer substrate at discrete locations.

6. The method of claim 5 wherein the step of forming photodiodes directly on said semiconductor wafer substrate at discrete locations further comprises:
    first removing said VCSEL layers on said semiconductor wafer substrate at discrete locations.

7. A method of manufacturing monolithic VCSEL and photodetector pairs, said method comprising the steps of:
    forming VCSEL layers directly on a semiconductor wafer substrate by
        forming first mirror layers;
        forming a first cladding layer on said first mirror layers;
        forming an active region on said first cladding layer;
        forming a second cladding layer on said active region;
        forming second mirror layers on said second cladding layer;
    defining active regions and inactive regions by forming isolation regions in the VCSEL layers; and then
    forming photodiodes distributed across said wafer on said second mirror layers of inactive VCELs.

8. A method of manufacturing monolithic VCSEL and photodetector pairs, said method comprising the steps of:
    forming VCSEL layers directly on a semiconductor wafer substrate by
        forming first mirror layers;
        forming a first cladding layer on said first mirror layers;
        forming an active region on said first cladding layer;
        forming a second cladding layer on said active region;
        forming second mirror layers on said second cladding layer;
    forming photodiodes distributed across said wafer by
        forming distributed p-type layers on a topmost second mirror layer;
        forming an intrinsic layer on said distributed p-type layers;
        forming an n-type layer on said intrinsic layers;
        forming a photodiode cathode contact on each of said n-type layers; and
        forming distributed photodiode anode contacts on said topmost second mirror layer.

9. The method of claim 1 further comprising the step of:
    prohibiting operation of said inactive VCSELs by shorting said semiconductor wafer substrate to said photodiode anode contact to ensure that said active VCSELs will not become forward biased.

10. A method of manufacturing an integrated VCSEL and photodetector pair, said method comprising the steps of:
    forming layers of a VCSEL on a semiconductor substrate;
    forming layers of a photodiode on a top-most layer of a first portion of said VCSEL layers;
    isolating a second portion of said VCSEL layers from said photodiode layers by implanting an isolation region between said first and second portions of said VCSEL layers;
    forming a VCSEL cathode contact connected to said semiconductor substrate;
    forming a VCSEL anode contact connected to said topmost VCSEL layer in said second portion;
    forming a photodiode cathode contact on a topmost layer of said photodiode layers; and
    forming a photodiode anode contact on said top-most VCSEL layer of said first portion of said VCSEL layers.

11. The method of claim 10 wherein the step of forming a VCSEL anode contact connected to said top-most VCSEL layer in said second portion further comprises:

forming a VCSEL anode contact overlapping said topmost VCSEL layer in said second portion and said isolation region.

12. The method of claim 10 further comprising the step of:

prohibiting operation of said first portion of said VCSEL layer as a VCSEL by shorting said substrate to said topmost layer of said VCSEL layers in said first portion.

* * * * *